United States Patent [19]

Tanigawa

[11] Patent Number: 5,294,561
[45] Date of Patent: Mar. 15, 1994

[54] METHOD FOR MANUFACTURING HIGHLY-INTEGRATED STACKED CAPACITOR

[75] Inventor: Takaho Tanigawa, Tokyo, Japan
[73] Assignee: NEC Corporation, Tokyo, Japan
[21] Appl. No.: 111,460
[22] Filed: Aug. 25, 1993

[30] Foreign Application Priority Data

Aug. 25, 1992 [JP] Japan .................. 4-225997

[51] Int. Cl.⁵ .............................. H01L 21/72
[52] U.S. Cl. ..................... 437/60; 437/195; 437/915; 437/982
[58] Field of Search ........... 437/47, 60, 195, 240, 437/915, 919, 982; 148/DIG. 14, DIG. 133

[56] References Cited

U.S. PATENT DOCUMENTS

| | | | |
|---|---|---|---|
| 4,987,092 | 1/1991 | Kobayashi et al. | 437/915 |
| 5,162,249 | 11/1992 | Kim | 437/60 |
| 5,238,862 | 8/1993 | Blalock et al. | 437/60 |

FOREIGN PATENT DOCUMENTS 1-130556 5/1989 Japan .

Primary Examiner—Brian E. Hearn
Assistant Examiner—Chandra Chaudhari
Attorney, Agent, or Firm—Sughrue, Mion, Zinn, Macpeak & Seas

[57] ABSTRACT

An impurity doped region is formed in a semiconductor substrate, and an insulating layer is formed thereon. A conductive layer is formed and is patterned by a photolithography process Then, a conductive sidewall is formed inside of the conductive layer. The insulating layer is etched with a mask of the conductive sidewall and the conductive layer to create a contact hole leading to the impurity doped region. A capacitor lower electrode layer is deposited within the contact hole. Thus, a capacitor insulating layer and a capacitor upper electrode layer are formed, to obtain a stacked capacitor.

6 Claims, 4 Drawing Sheets

METHOD FOR MANUFACTURING HIGHLY-INTEGRATED STACKED CAPACITOR

BACKGROUND OF THE INVENTION

1. Field of the Invention

The present invention relates to a method for manufacturing a stacked capacitor which can be used in a memory cell of a dynamic random access memory (DRAM).

2. Description of the Related Art

Generally, in a DRAM, each memory cell is formed by one metal oxide semiconductor (MOS) transistor and one capacitor. Also, recently, a stacked capacitor, which has two electrode layers with an insulating layer therebetween, has been used as such a capacitor, to thereby increase the density of the DRAM.

According to a prior art method for manufacturing a stacked capacitor, an insulating layer is deposited on a semiconductor substrate including a drain region of a MOS cell transistor, and is patterned by a photolithography process to create a contact hole leading to the drain region. Then, a conductive layer, i.e., a lower electrode layer is deposited and is connected to the drain region. Finally, an insulating layer and a conductive layer, i.e., an upper electrode layer, are deposited to thereby obtain a stacked capacitor.

In the above-mentioned prior art stacked capacitor manufacturing method, however, since the contact hole for the capacitor lower electrode is formed directly by the photolithography process, so that the size of the contact hole is dependent upon the photolithography process, it is impossible to make the size of the contact hoe smaller than a size determined by the photolithography process. Therefore, there is a limit to the integration density of the stacked capacitor in accordance with the photolithographyprocess.

SUMMARY OF THE INVENTION

It is, therefore, an object of the present invention to provide a method for manufacturing a highly-integrated stacked capacitor.

Another object of the present invention is to avoid a short-circuit between a gate electrode of a MOS cell transistor and a stacked capacitor.

According to the present invention, an impurity doped region is formed in a semiconductor substrate, and an insulating layer is formed thereon. A conductive layer is formed and is patterned by a photolithography process. Then, a conductive sidewall is formed inside of the conductive layer. The insulating layer is etched with a mask of the conductive sidewall and the conductive layer to create a contact hole leading to the impurity doped region. A capacitor lower electrode layer is deposited within the contact hoe. Finally, a capacitor insulating layer and a capacitor upper electrode layer are formed thereon, to obtain a stacked capacitor. That is, the contact hole is formed in self-alignment with the conductive sidewall, and therefore, the size of the contact hole can be reduced by the conductive sidewall in comparison with that determined by the direct photolithography process.

BRIEF DESCRIPTION OF THE DRAWINGS

The present invention will be more clearly understood from the description as set forth below, with reference to the accompanying drawings, wherein.

DESCRIPTION OF THE PREFERRED EMBODIMENTS

A first embodiment of the present invention will be explained with reference to FIGS. 1A through 1I.

Figure 1A:
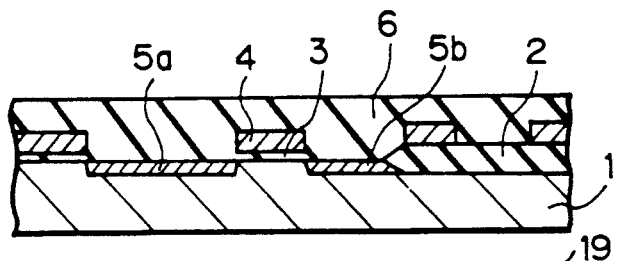
FIGS. 1A through 1I are cross-sectional views illustrating a first embodiment of the method for manufacturing a semiconductor memory device including a stacked capacitor according to the present invention.

Referring to FIG. 1A, a selective oxidation (so-called local oxidation of silicon (LOCOS)) is performed upon a semiconductor substrate 1 made of a p-type monocrystaline silicon with a mask of silicon nitride and silicon dioxide (not shown). to thereby create a thick field insulating layer 2 made of silicon dioxide. Next, a thin gate insulating layer 3 made of silicon dioxide is formed by thermally oxidizing the semiconductor substrate 1. Then, after a gate electrode 4 made of polycrystaline silicon is deposited on the gate insulating layer 3 by chemical vapor deposition (CVD), impurities of an N-type are doped into the semiconductor substrate 1 with a mask of the gate electrode 4 and the thick field insulating layer 2, to create a source region 5a and a drain region 5b.

Then, an insulating layer 6 made of boron-and phosphorus-doped silicon dioxide (so-called boron-doped phospho silicate glass (BPSG)) is deposited by CVD. This BPSG insulating layer 6 having a thickness of about 0.4 μm is heated for a period of about 30 minutes in an atmosphere of nitrogen at a temperature of about 900° C., and therefore, the BPSG insulating layer 6 is fluidized so as to make the surface thereof flat as shown in FIG. 1A.

Figure 1B:
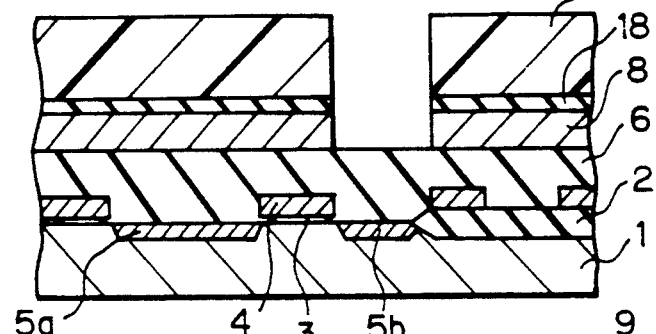

Next, referring to FIG. 1B, a conductive layer 8 made of polycrystalline silicon having a thickness of about 0.4 μm is deposited by CVD, and an insulating layer 18 made of silicon dioxide having a thickness of about 0.1 μm is deposited by CVD. Next, a photoresist layer 19 is formed and is patterned by a photolithography process, and the insulating layer 18 and the conductive layer 8 are etched with a mask of the photoresist layer 19. Then, the photoresist layer 19 is removed.

Figure 1C:
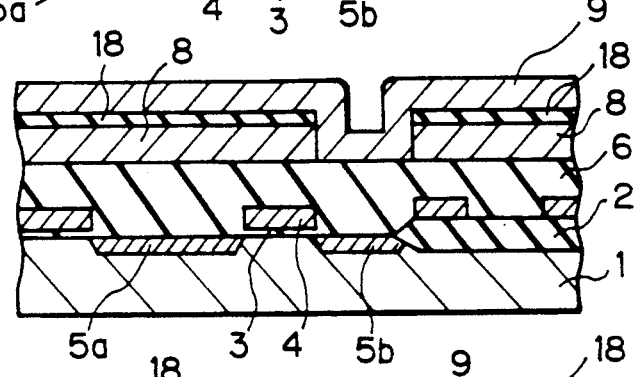

Next, referring to FIG. 1C, a conductive layer 9 made of polycrystaline silicon having a thickness of about 0.3 μm is deposited by CVD.

Figure 1D:
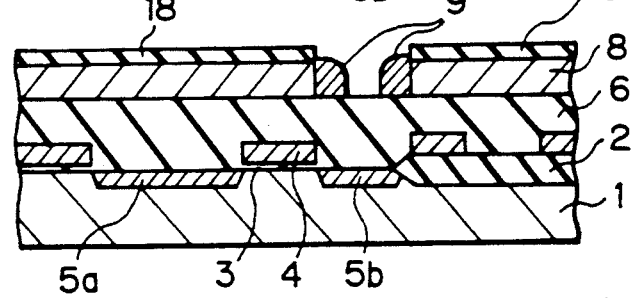

Next, referring to FIG. 1D, the conductive layer 9 is etched back, so that it remains as a sidewall. The conductive sidewall 9 is located inside of the conductive layer 8.

Figure 1E:
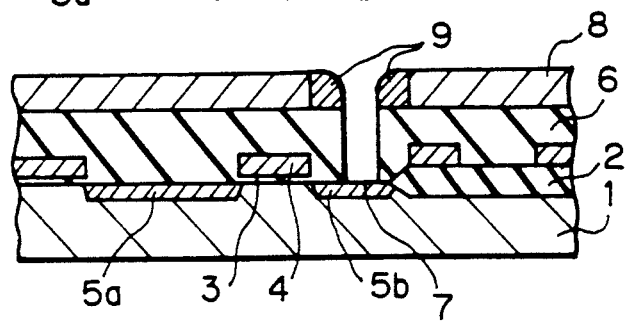

Next, referring to FIG. 1E, the insulating layer 6 is etched with a mask of the conductive layer 8 and the conductive sidewall 9, to thereby create a contact hole leading to the drain region 5b. In this case, the insulating layer 18 is removed simultaneously with the etching of the insulating layer 6 Note that, if the thickness of the conductive sidewall 9 is about 0.3 μm, the distance between the gate electrode 4 and the contact hole is also about 0.3 μm, so as to surely maintain an electrical insulation between the gate electrode 4 and the capacitor lower electrode (shown not in FIG. 1E, but shown in FIG. 1F as reference numeral 10) in the contact hole.

Figure 1F:
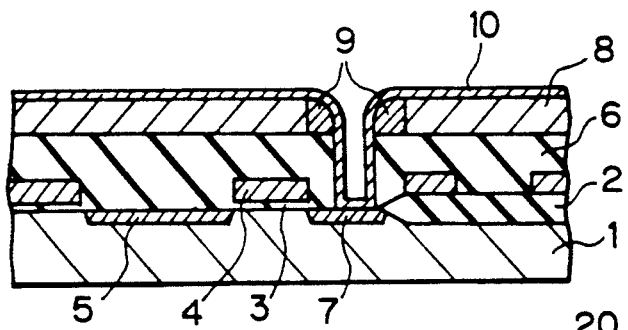

Next, referring to FIG. 1F, a capacitor lower electrode layer 10 made of polycrystaline silicon having a thickness of about 0.1 μm is deposited by CVD.

Figure 1G:
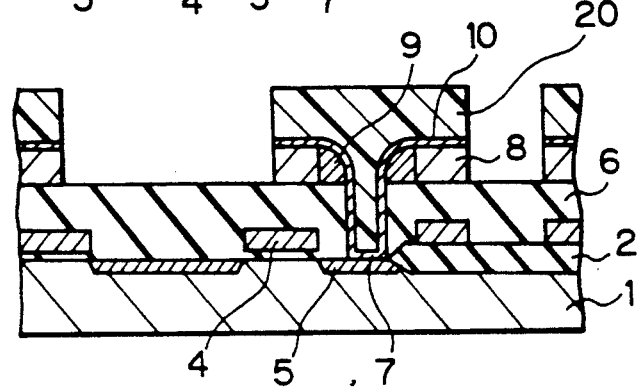

Next, referring to FIG. 1G, a photoresist layer 20 is formed and is patterned by a photolithography process. Then, the conductive layers 10 and 8 are etched with the patterned photoresist layer 20. Then, the photoresist layer 20 is removed. Note that the capacitor lower electrode layer 10 including the conductive layer 8 and the conductive sidewall 9 serves as a capacitor lower electrode.

Figure 1H:
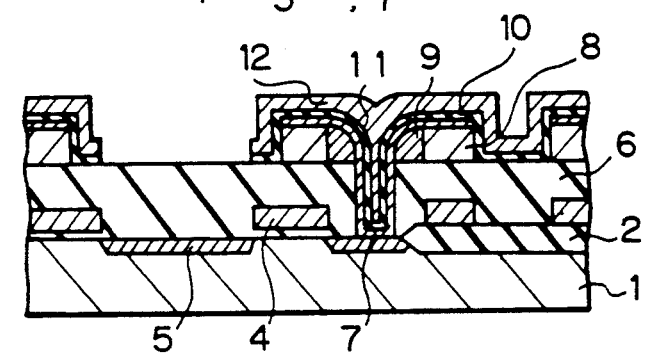

Next, referring to FIG. 1H, a capacitor insulating layer 11 made of silicon dioxide is formed by thermally oxidizing the capacitor lower electrode layer 10 or by CVD. Next, a capacitor upper electrode layer 12 made of polycrystaline silicon is deposited by CVD. Then, the capacitor upper electrode layer 12 and the capacitor insulating layer 11 are patterned by a photolithography process.

Figure 1I:
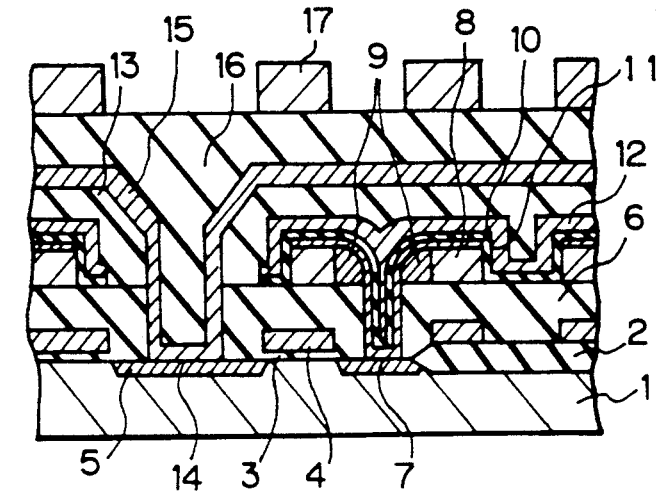

Finally, referring to FIG. 1I, an insulating layer 16 made of silicon dioxide is deposited by CVD, and is patterned by a photolithography process, to thereby create a contact hole for a bit line layer 15 which is made of tungsten silicide ($WS_i^2$). Further, an insulating layer 16 made of silicon dioxide and an aluminum connection 17 are formed, to compete the semiconductor memory device.

A second embodiment of the present invention will now be explained with reference to FIGS. 2A through 2I.

Figure 2A:
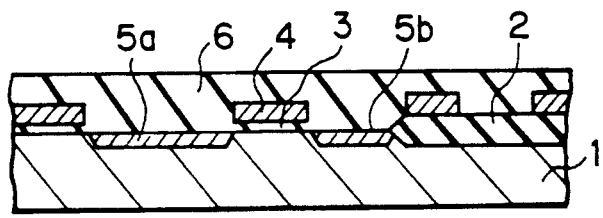
FIGS. 2A through 2I are cross-sectional views illustrating a second embodiment of the method for manufacturing a semiconductor memory device including a stacked capacitor according to the present invention.

Referring to FIG. 2A, which is the same as FIG. 1A, a selective oxidization (so-called (LOCOS)) is performed upon a semiconductor substrate 1 made of a P-type monocrystaline silicon with a mask of silicon nitride and silicon dioxide (not shown), to thereby create a thick field insulating layer 2 made of silicon dioxide. Next, a thin gate insulating layer 3 made of silicon dioxide is formed by thermally oxidizing the semiconductor substrate 1. Then, after a gate electrode 4 made of polycrystaline silicon is deposited on the gate insulating layer 3 by CVD, impurities of an N-type are doped into the semiconductor substrate 1 with a mask of the gate electrode 4 and the thick field insulating layer 2, to create a source region 5a and a drain region 5b.

Then, an insulating layer 6 made of so-called boron-doped phospho silicate glass BPSG is deposited by CVD. This BPSG insulating layer 6 having a thickness of about 0.4 μm is heated for a period of about 30 minutes in an atmosphere of nitrogen at a temperature of about 900° C., and therefore, the BPSG insulating layer 6 is fluidized so as to make the surface thereof flat as shown in FIG. 2A.

Figure 2B:
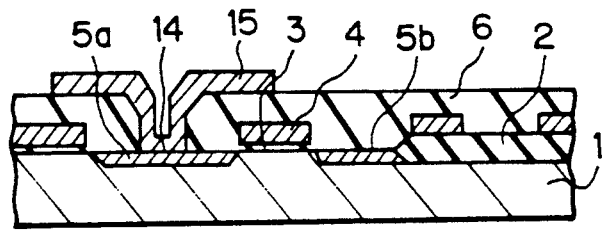

Next, referring to FIG. 2B, the insulating layer 6 is etched by a photolithography process, to thereby create a contact hoe for a bit line layer 15 made of tungsten silicide ($WS_i^2$).

Figure 2C:
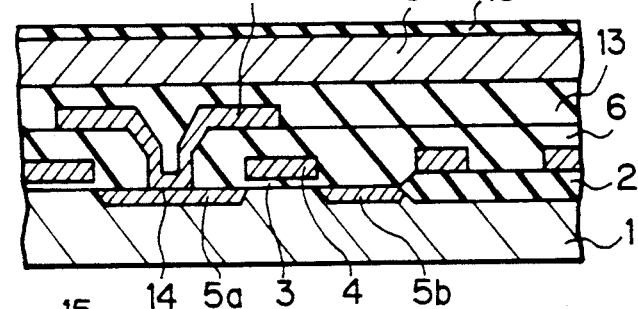

Next, referring to FIG. 2C, an insulating layer 13 made of so-called BPSG is deposited by CVD. This BPSG insulating layer 13 having a thickness of about 0.4 μm is also heated for a period of about 30 minutes in an atmosphere of nitrogen at a temperature of about 900° C., and therefore, the BPSG insulating layer 13 is fluidized so as to make the surface thereof flat as shown in FIG. 2C. Then, a conductive layer 8 made of polycrystalline silicon having a thickness of about 0.4 μm is deposited by CVD, and an insulating layer 18 made of silicon dioxide having a thickness of about 0.1 μm is deposited by CVD.

Figure 2D:
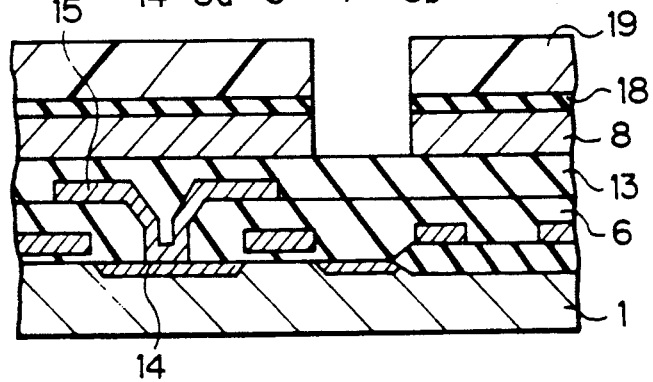

Next, referring to FIG. 2D, a photoresist layer 19 is formed and is patterned by a photolithography process, and the insulating layer 18 and the conductive layer 8 are etched with a mask of the photoresist layer 19. Then, the photoresist layer 19 is removed.

Figure 2E:
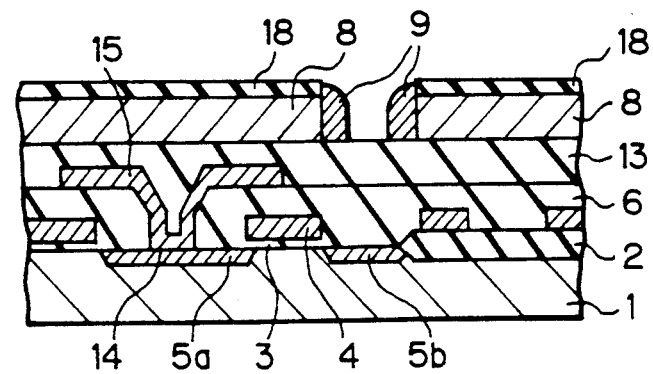

Next, referring to FIG. 2E, a conductive layer 9 made of polycrystalline silicon having a thickness of about 0.3 μm is deposited by CVD. Then, the conductive layer 9 is etched back, so that it remains as a sidewall. The conductive sidewall 9 is located inside of the conductive layer 8.

Figure 2F:
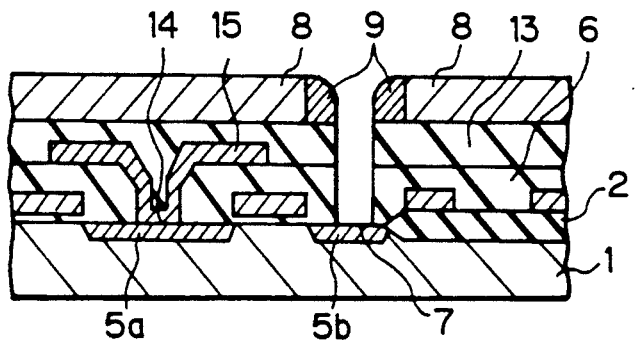

Next, referring to FIG. 2F, the insulating layers 13 and 6 are etched with a mask of the conductive layer 8 and the conductive sidewall 9, to thereby create a contact hole leading to the drain region 5b. Also, in this case, the insulating layer 18 is removed simultaneously with the etching of the insulating layers 13 and 6. Note that, if the thickness of the conductive sidewall 9 is about 0.3 μm, the distance between the gate electrode 4 and the contact hole is also about 0.3 μm, so as to surely maintain an electrical insulation between the gate electrode 4 and the capacitor lower electrode (shown not in FIG. 2E, but shown in FIG. 2G as reference numeral 10) in the contact hole.

Figure 2G:
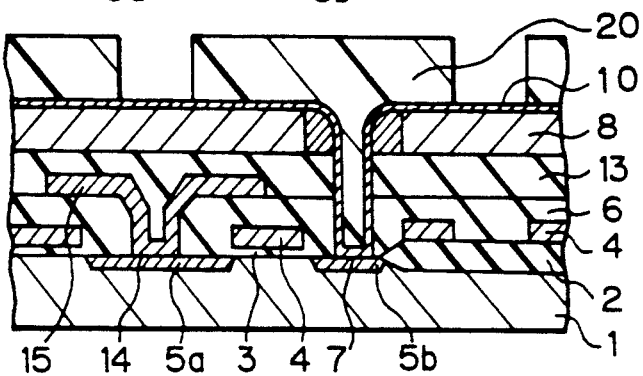

Next, referring to FIG. 2G, a capacitor lower electrode layer 10 made of polycrystalline silicon having a thickness of about 0.1 μm is deposited by CVD. Then, a photoresist layer 20 is formed and is patterned by a photolithography process.

Figure 2H:
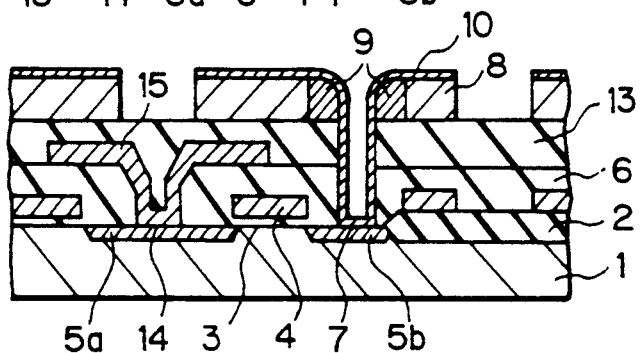

Next, referring to FIG. 2H, the conductive layers 10 and 8 are etched with the patterned photoresist layer 20. Then, the photoresist layer 20 is removed. Also, note that the capacitor lower electrode layer 10 including the conductive layer 8 and the conductive sidewall 9 serves as a capacitor lower electrode.

Figure 2I:
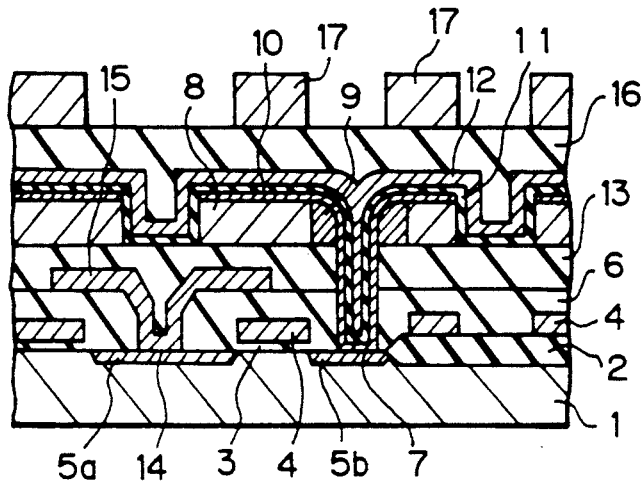

Finally, referring to FIG. 2I, a capacitor insulating layer 11 made of silicon dioxide is formed by thermally oxidizing the capacitor lower electrode layer 10 or by CVD. Next, a capacitor upper electrode layer 12 made of polycrystalline silicon is deposited by CVD. Then, an insulating layer 16 made of silicon dioxide is deposited by CVD. Further, an aluminium connection 17 are formed, to complete the semiconductor memory device.

In the second embodiment, since the bit line layer 15 is located under the capacitor lower electrode layer 10, the step or height of the bit line layer 15 can be reduced as compared with the first embodiment to avoid the disconnection thereof. For example, the step or height of the bit line layer 15 is about 0.8 μm in the first embodiment, while it is about 0.1 μm in the second embodiment.

As explained hereinbefore, according to the present invention, since the contact hole for the capacitor lower electrode layer is formed in self-alignment with the conductive layer and its sidewall, the size of this contact hole can be reduced, thus increasing the integrated density of the stacked capacitor, i.e., the integration density of the DRAM.

What is claimed is:

1. A method for manufacturing a stacked capacitor, comprising the steps of:
    forming an impurity doped region within a semiconductor substrate, the conductivity type of said impurity doped region being opposite to that of said semiconductor substrate;
    forming an insulating layer on said semiconductor substrate;

forming a conductive layer on said insulating layer;

patterning said conductive layer to create an opening therein, said opening being located over said impurity doped region;

forming a conductive sidewall along the inside of the opening of said conductive layer;

patterning said insulating layer with a mask of said conductive layer and said conductive sidewall to create a contact hole leading to said impurity doped region;

forming a capacitor lower electrode layer, said conductive lower electrode layer being electrically connected to said impurity doped region, said conductive layer and said conductive sidewall;

forming a capacitor insulating layer on said capacitor lower electrode layer; and forming a capacitor upper electrode layer on said capacitor insulating layer.

2. A method as set forth in claim 1, wherein an upper surface of said insulating layer is flat.

3. A method for manufacturing a semiconductor memory device comprising the steps of:

forming a thick insulating layer on a semiconductor substrate of a first conductivity type;

forming a gate insulating layer on said semiconductor substrate;

forming a gate electrode layer on said gate insulating layer;

forming a source region and a drain region by introducing impurities of a second conductivity type opposite to said first conductivity type into said semiconductor substrate with a mask of said thick insulating layer and said gate electrode layer;

forming a first insulating layer on said semiconductor substrate, said thick insulating layer and said gate electrode layer;

forming a conductive layer on said first insulating layer;

patterning said conductive layer to create an opening therein said opening being located over said drain region;

forming a conductive sidewall along the inside of the opening of said conductive layer;

patterning said first insulating layer with a mask of said conductive layer and said conductive sidewall to create a contact hole leading to said drain region;

forming a capacitor lower electrode layer, said conductive lower electrode layer being electrically connected to said drain region, said conductive layer and said conductive sidewall;

forming a capacitor insulating layer said capacitor lower electrode layer;

forming a capacitor upper electrode layer on said capacitor insulating layer;

patterning said capacitor upper electrode layer, said capacitor insulating layer and said capacitor lower electrode layer;

forming a second insulating layer on said capacitor upper electrode and said first insulating layer;

patterning said second insulating layer and said first insulating layer to create a contact hole leading to said source region; and forming a bit line electrode layer to be connected to said source region.

4. A method as set forth in claim 3, wherein an upper surface said first insulating layer is flat.

5. A method for manufacturing a semiconductor memory device comprising the steps of:

forming a thick insulating layer on a semiconductor substrate of a first conductivity type;

forming a gate insulating layer on said semiconductor substrate;

forming a gate electrode layer on said gate insulating layer;

forming a source region and a drain region by introducing impurities of a second conductivity type opposite to said first conductivity type into said semiconductor substrate with a mask of said thick insulating layer and said gate electrode layer;

forming an first insulating layer on said semiconductor substrate, said thick insulating layer and said gate electrode layer;

patterning said first insulating layer to create a contact hole leading to said source region;

forming a bit line electrode layer to be connected to said source region;

forming a second insulating layer on said bit line electrode layer and said first insulating layer;

forming a conductive layer on said second insulating layer;

patterning said conductive layer to create an opening therein, said opening being located over said drain region;

forming a conductive sidewall along the inside of the opening of said conductive layer;

patterning said first and second insulating layers with a mask of said conductive layer and said conductive sidewall to create a contact hole leading to said drain region;

forming a capacitor lower electrode layer, said conductive lower electrode layer being electrically connected to said drain region, said conductive layer and said conductive sidewall;

forming a capacitor insulating layer on said capacitor lower electrade layer;

forming a capacitor upper electrode layer on said capacitor insulating layer.

6. A method as set forth in claim 5, wherein an upper surface said first insulating layer is flat.

* * * * *

UNITED STATES PATENT AND TRADEMARK OFFICE
CERTIFICATE OF CORRECTION

PATENT NO. : 5,294,561
DATED : March 15, 1994
INVENTOR(S) : Takaho TANIGAWA

It is certified that error appears in the above-identified patent and that said Letters Patent is hereby corrected as shown below:

Col. 1, line 35, delete "hoe" and insert --hole--;

Col. 1, line 56, delete "hoe" and insert --hole--;

Col. 2, line 19, delete "." and insert --,--;

Col. 3, line 55, delete "hoe" and insert --hole--;

Col. 4, line 36, delete "21" and insert --2I".

Signed and Sealed this

Sixth Day of September, 1994

Attest:

BRUCE LEHMAN

Attesting Officer       Commissioner of Patents and Trademarks